United States Patent
England et al.

(10) Patent No.: US 6,515,408 B1
(45) Date of Patent: Feb. 4, 2003

(54) ION BEAM APPARATUS AND A METHOD FOR NEUTRALIZING SPACE CHARGE IN AN ION BEAM

(75) Inventors: Jonathan Gerald England, Horsham (GB); Andrew Holmes, Marcham (GB); David Armour, Salford (GB); Jaap Van Den Berg, Didsbury (GB); Stephen Moffatt, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/700,206

(22) PCT Filed: May 12, 1999

(86) PCT No.: PCT/GB99/01500
§ 371 (c)(1),
(2), (4) Date: Feb. 15, 2001

(87) PCT Pub. No.: WO99/59182
PCT Pub. Date: Nov. 18, 1999

(30) Foreign Application Priority Data

May 12, 1999 (GB) ............................................. 9810144

(51) Int. Cl.[7] .................................................. H05H 3/00
(52) U.S. Cl. .............................. 313/359.1; 313/231.01
(58) Field of Search ........................... 313/359.1, 360.1, 313/361.1, 362.1, 231.01

(56) References Cited

U.S. PATENT DOCUMENTS 4,886,971 A  12/1989  Yasushi et al.

FOREIGN PATENT DOCUMENTS

| JP | 63274051 | 3/1989 |
| JP | 07161320 | 6/1995 |
| JP | 0180662  | 7/1997 |

OTHER PUBLICATIONS

Leung K N et al.: "An Electron–Beam Charge Neutralization System for Ion Implanters" Nuclear Instruments & Methods in Physics Research, Section—B: Beam Interactions with Materials and Atoms, vol. B55, No. 1 / 04, Apr. 2, 1991, pp. 94–96, XP000230669 ISSN: 0168–583X p. 94–p. 95; figure 1.

*Primary Examiner*—Vip Patel
(74) *Attorney, Agent, or Firm*—Boult Wade Tennant (57) ABSTRACT

A source of thermionic electrons is provided inside the flight tube of a magnet, especially an analysing magnet, and extends along the beam flight path. This allows space charge to be neutralised along the beam's axis in spite of severely restricted electron mobility in this direction owing to the presence of substantially transverse magnetic field. Thermionically emitted electrons may contribute directly to the neutralisation of space charge in positive ion beams, or, in the case of negative ion beams, indirectly by ionizing residual or deliberately introduced neutral gas atoms or molecules. Examples are described and claimed in which the source is arranged outside the nominal beam envelope in the flight tube, but linked to the beam by magnetic flux generated in the flight tube. This reduces erosion of the source by the beam and so reduces beam contamination. In these examples, an important feature is the provision of electron repellers to reflect electrons back and forth across the beam. Alternative arrangements are described and claimed in which the source is positioned inside the beam. The thermionic electron source may comprise an array of filaments, and preferably is negatively biased with respect to the flight tube. Adjustment of this bias enables the energy of emitted electrons to be controlled.

39 Claims, 8 Drawing Sheets

ION BEAM APPARATUS AND A METHOD FOR NEUTRALIZING SPACE CHARGE IN AN ION BEAM

This application is the national phase under 35 U.S.C. §371 of PCT International Application No. PCT/GB 99/01500 which has an International filing date of May 12, 1999, which designated the United States of America.

The present invention is concerned with neutralising space charge in ion beams travelling through regions of applied magnetic field, and in particular, although not exclusively, with neutralising space charge in an ion beam as it travels through the flight tube of an analysing magnet.

An analysing magnet generates a substantially uniform magnetic field in its flight tube, causing an ion travelling through the flight tube to follow a curved path in a plane perpendicular to the direction of the magnetic field. The radius of the curved path is given by:

$$r = mv/qB = (2Em)^{1/2}/qB$$

where v, E, m and q respectively are the velocity, kinetic energy, mass and charge of the ion, and B is the magnitude of the magnetic flux density in the flight tube. The analysing magnet can therefore be used to resolve spatially (in a dispersion plane perpendicular to the magnetic field in the flight tube), ions in a beam according to their energy, mass and charge.

In ion implanters, an analysing magnet is used in conjunction with a selection slit to select ions of the required species from an incident beam for implantation in a target semiconductor substrate. Typically, the incident beam will comprise ions having substantially the same energy, and the magnet is arranged to focus those ions having the desired mass/charge ratio at the selection slit so that only they pass through the slit and go on to impinge on the target.

In spectrometry applications, analysing magnets are used to resolve ions in a beam according to their mass, energy and charge for separate detection.

Ideally, for both ion implantation and spectrometry applications, ions in the beam entering the flight tube having the same energy, charge and mass should all be focused by the analysing magnet onto a common line, perpendicular to the dispersion plane, as they exit.

However, in the absence of any neutralising effect, a beam containing only ions of a particular polarity will experience space charge effects. The mutual repulsion of the ions in the beam tends to cause the beam to diverge or "blow up". This mutual repulsion means that the position at which an ion exits the magnet is no longer solely determined by its incident velocity, mass and charge, and the applied magnetic field.

In ion implantation applications, although an incident ion may have the desired mass/charge ratio, because of space charge effects it may not be focused on the selection slit and so may not reach the target. This reduces the ion implantation current reaching the target from a given source and increases the process time required to achieve a desired implantation dose. In addition, space charge effects may result in an increased number of incident beam ions hitting the sides of the flight tube. This further reduces the implantation current reaching the target and can result in contamination of the target by particles sputtered off the flight tube.

Similarly, in spectrometry applications, beam "blow up" inhibits the spatial resolution of different ions and reduces signal intensity.

In applications where a scanning magnet is used to deflect an ion beam (for example to scan the beam across a target) beam blow up inside the magnet is also undesirable. It reduces beam intensity and control accuracy.

The effect of beam space charge is especially severe for relatively low energy beams (e.g. 1–2 keV) since for the same beam current there is a higher density of ions in a low energy beam.

In regions of zero electric field, such as the flight tube of an analysing or scanning magnet, self neutralisation of ion beams tends to occur through the production of electrons and positive ions resulting from collisions between beam ions and atoms of residual gas in the vacuum chamber through which the beam is passing. However, this self neutralisation may be insufficient adequately to reduce beam blow up. This is particularly true for relatively low energy ion beams, as, at low energies, the cross sections for electron production during interaction between the beam ions and residual gas atoms are extremely small.

Also, some self neutralisation may occur as a result of local electron production from the beam striking the inside of the flight tube along the entire beam path through the magnet. Again however, this may be insufficient to reduce beam blow up to acceptably low levels, and in any case is to be avoided as it results in beam loss and unwanted particle generation.

In regions of zero electric field and zero magnetic field (i.e. "drift space") a known technique to neutralise space charge is to flood the region through which the ion beam travels with low energy (typically a few eV) electrons or ions, produced, for example, in a plasma chamber adjacent to the beam flight path. In this drift space the electrons or ions are mobile and can move along and across the beam to minimise beam potential.

In regions of applied magnetic field however, the magnetic field severely limits the mobility of these electrons or ions. In applied fields of sufficient magnitude to deflect beams of ions with energies in excess of, say, a few keV, low energy charged particles, and electrons in particular (with their small mass,) will follow paths having circular projections of very small radii on a plane perpendicular to the direction of applied field. In effect, the electrons are restricted just to following the magnetic field lines. They have substantially zero mobility perpendicular to the applied field, which in the case of analysing magnets or scanning magnets means that the electrons have substantially zero mobility along the beam axis.

In regions where the electric field is nominally zero, such as inside the earthed flight tube of an analysing magnet, there may in fact be a small amount of electron motion perpendicular to the direction of applied magnetic field owing to the presence of various small electric fields such as those resulting from the beam itself. This motion is known as ExB motion. However, in such nominally E-field-free regions, electron mobility along the beam is, in general, very restricted.

Thus it is not possible to neutralise beam space charge inside regions of applied field by introducing low energy charged particles to adjacent drift space regions as the charged particles will not be able to migrate into the beam.

According to a first aspect of the present invention there is provided ion beam apparatus comprising:

a analysing magnet including a flight tube for receiving and conveying through the magnet a beam of ions, the magnet being operable to generate a substantially uniform magnetic field in the flight tube to deflect beam ions according to their mass/charge ratio in a dispersion plane perpendicular to the direction of said uniform magnetic field; and a thermionic electron source inside the flight tube, arranged adjacent and outside a nominal cross section of a beam of ions travelling through the magnet and extending along a nominal flight path of a beam travelling through the magnet, the thermionic electron source being further arranged such that the projection of the thermionic electron source on the dispersion plane and the nominal projection on the dispersion plane of an ion beam travelling through the magnet overlap at a plurality of positions along the nominal flight path of the beam.

Thus, magnetic flux generated by the magnet may link the thermionic electron source and a beam of ions travelling through the magnet at a plurality of positions along the flight path, and electrons may be emitted thermionically from the source into the beam at these positions.

This enables space charge to be neutralised at a plurality of positions along the beam in spite of low electron mobility along the beam, and so reduces "blow up", keeping the beam tight. The thermionic electron source is positioned outside the nominal beam envelope to reduce beam contamination resulting from sputtering off the source and the associated erosion of the source.

In the presence of the magnetic field generated by the analysing magnet, electrons emitted from the thermionic electron source will simply follow field lines passing through the source. These field lines will be perpendicular to the dispersion plane of the magnet. Only those emitted electrons travelling along field lines which also link the ion beam will, therefore, enter the beam and contribute to neutralisation of its space charge (either directly, in the case of a beam of positive ions, or, in the case of a beam of negative ions, by colliding with residual or deliberately introduced gas atoms or molecules to produce positive ions).

Clearly, the greater the degree of overlap between the projections on the dispersion plane of the thermionic electron source and the ion beam, the greater the proportion of electrons emitted from the source that are able to enter the beam.

Advantageously, the thermionic electron source may extend substantially in a plane spaced from and parallel to the dispersion plane. In an analysing magnet with a nominally horizontal dispersion plane, the thermionic electron source may therefore be arranged in a plane just above, or just below the nominal beam cross section.

In a preferred embodiment the thermionic electron source is positioned as close as possible to the nominal beam cross section to maximise the proportion of the flight tube cross section available for beam transport.

In certain embodiments, the thermionic electron source comprises a longitudinal electrically conductive filament running along the nominal flight path, above and substantially parallel to the nominal centre of an ion beam travelling through the analysing magnet. The filament may therefore be linked to the beam by magnetic flux along a substantial part of its length, and so can be used to emit electrons thermionically to neutralise space charge along a large fraction of the beam's path length through the magnet.

A plurality of spaced-apart longitudinal filaments may be used to neutralise space charge both along the length and across the width of a beam.

In a further preferred embodiment, the thermionic electron source comprises a plurality of transverse filaments, spaced along the flight path, and each extending across the nominal beam width.

The transverse filaments may for example, be connected to bus bars at opposite sides of the beam, or may be in the form of hairpins, connected to two separate bus bars at the same side of the beam. Hairpin geometry provides the advantage that the filaments are less prone to breaking as a result of relative movement of the bus bars, or thermal expansion or contraction.

The transverse filaments provide the advantage of enabling space charge to be neutralised across the beam at a plurality of locations along its path through the magnet.

The thermionic electron source may comprise an array or grid of filaments, which may be planar and, for example, be machined or cut from a graphite sheet.

Heat shields may be incorporated between the thermionic electron source and the inside of the flight tube to reduce the power needed to maintain the source at a temperature sufficient to yield a desired emission current.

A wide variety of materials may be used for the filament or filaments,including, for example, tungsten.

In a preferred embodiment however, graphite filaments are employed. For ion implantation applications in particular, graphite filaments are desirable because carbon sputtered off the filaments as a result of beam strike is a more tolerable beam contaminant than are metal atoms or ions.

In cases where the beam travelling through the magnet comprises just positive ions, the thermionically emitted electrons may neutralise the beam space charge directly. The electrons travel along flux lines into the beam, and once inside contribute to space charge neutralisation.

In the case of beams comprising negative ions travelling through the magnets, thermionic electrons may be used to ionise residual gas atoms or molecules in the partial vacuum of the flight tube. The positive ions produced by collisions between the thermionic electrons and the residual atoms or molecules may then contribute to the neutralisation of beam space charge.

To facilitate the neutralisation of negative ion beams, charge-neutral atoms or molecules may deliberately be introduced into the flight tube for ionisation by thermionically emitted electrons.

A thermionically emitted electron entering the beam will, in general, only remain in the beam if it suffers a collision inside the beam, and as a result loses energy. Otherwise, it will have sufficient energy to escape any beam potential well and will cease to contribute to beam space charge neutralisation. Collisions with ions or neutral atoms may be elastic or inelastic. At very low energies, below the thresholds for excitation and ionisation, elastic collisions, which involve very small energy transfers, dominate and the electrons may simply bounce off their collision partners and escape from the beam. Collisions with other electrons would involve greater energy transfer, but the collision cross-section is very small. The inelastic collision cross-sections can be increased significantly by increasing the electron energy by applying a negative bias to the thermionic electron source. In preferred embodiments therefore, the thermionic electron source is negatively biased with respect to the flight tube, and this bias voltage may be adjusted to control the energy of the emitted electrons.

This bias enables the injection of electrons into the beam to be controlled and also provides the energy required to ionise the background (i.e. residual) gas which is important in the case of the space charge neutralisation of negative ion beams. Control of electron emission energy is also important in the case of positive ion beams in that slow positive ions produced by collisions between residual, or deliberately introduced, neutral gas atoms or molecules and low energy emitted electrons are an important feature of space charge neutralization because they help to trap electrons. If slow negative ions are produced, an unlikely process in most gases, they too would assist in the neutralization of the positive ion space charge.

A beam of positive ions may be surrounded by a sheath of negative space charge which provides a potential barrier to the entry of thermionically emitted electrons into the core of the beam. Biasing the source can provide the emitted electrons with sufficient energy to penetrate this barrier.

Depending on the particular application, optimum biases in the range 3V to 70V have been found, although optimum values outside this range may be expected.

Advantageously, one or more electron repellers, may be arranged inside the flight tube and outside the nominal beam envelope to reflect electrons escaping the beam back into the beam. The electron repellers are negatively biased with respect to the thermionic source, and the bias may be adjustable. In one application, a weak optimum bias of 3V was found. The reflectors may be positioned on opposite sides of the beam, and enable the lifetime of electrons in the beam volume to be extended. Energetic electrons which, in the absence of collisions, would not remain in the beam, may be reflected back and forth substantially along field lines linking opposing repellers. The "confinement" of electrons between opposing repellers is possible because the mobility of electrons in directions perpendicular to the applied magnetic field is severely restricted.

The repellers may be planar, and may comprise graphite sheets. The repellers may in fact also function as heat shields.

According to a second aspect of the present invention there is provided ion beam apparatus comprising:

an analysing magnet including a flight tube for receiving and conveying through the magnet a beam of ions, the magnet being operable to generate a substantially uniform magnetic field in the flight tube to deflect beam ions according to their mass/charge ratio in a dispersion plane perpendicular to the direction of said uniform magnetic field; and a thermionic electron source inside the flight tube, extending along the nominal flight path of said beam and being arranged inside the nominal envelope of said beam.

The term "envelope" is used to denote the three-dimensional surface nominally bounding the beam, i.e. it represents the nominal extent of the beam. An object placed inside the nominal beam envelope will, therefore, nominally be struck by the beam. An object inside the nominal beam envelope is in the nominal path of the beam.

By positioning the source at least partially inside the beam, low energy electrons may be emitted which have insufficient energy to escape the beam potential well. These electrons may therefore remain in the beam for a significant time and contribute to space charge neutralisation. Again, the emitted electron energy may be controlled by varying the bias on the source with respect to the flight tube.

The source inside the beam may comprise an array of filaments, which may be planar or may follow a curved surface including the nominal beam centre line.

The array may extend over at least part of the height and/or the width of the beam to provide more homogeneous space charge neutralisation.

The array may comprise straight, curved, hair-pin or other geometry filaments, and may be a grid.

The source may be electrically conductive, may comprise carbon, and/or may comprise refractory material. The source may be arranged to be heated electrically, or by the beam, or both.

In order to reduce contamination of the beam conveyed to the remainder of the apparatus, downstream of the magnet, the parts of the thermionic electron source inside the nominal beam envelope (i.e. these parts nominally subjected to beam strike) may be arranged to be out of line of sight with the selection slit at the exit of the flight tube.

According to a third aspect of the present invention there is provided ion beam apparatus comprising:

a magnet arranged to generate a magnetic field in a flight tube to deflect a beam of ions travelling through said flight tube; and a thermionic electron source inside said flight tube, extending along the nominal flight path of said beam and arranged to emit electrons thermionically into said beam.

The source may be arranged outside the nominal beam envelope and further arranged to be linked to the beam at a plurality of positions along its path by magnetic flux generated by the magnet, or the source may be arranged at least partially inside the nominal beam envelope. The source may comprise an array of filaments, and the apparatus may further comprise electron repellers, heat shields, and means for biasing the source and the repellers.

According to a fourth aspect of the present invention there is provided a method of neutralising space charge in a beam of ions travelling in a flight tube through a magnet, the method comprising the steps of:

providing a source of thermionic electrons inside the flight tube, adjacent and outside the nominal cross section of the beam and extending along the nominal flight path of the beam;

arranging the thermionic electron source to be linked to the beam at a plurality of positions along the nominal flight path by magnetic flux generated by the magnet; and emitting electrons thermionically from the thermionic electron source.

According to a fifth aspect of the present invention there is provided a method of neutralising space charge in a beam of ions travelling in a flight tube through a magnet, the method comprising the steps of:

providing a source of thermionic electrons inside the beam, said source extending along the beam; and emitting electrons thermionically from said source.

The magnet may, for example, be an analysing magnet, a scanning magnet, or a magnet arranged to deflect the beam for other purposes. It will be apparent that the term "flight tube" is used simply to denote the region of space inside the magnet through which ion beam travels. The "flight tube" in general need have no sides as such, but typically comprises an electrically conductive tube inside which the electric field is arranged to be zero.

Embodiments of the present invention will now be described with reference to the accompanying drawings in which.

A first embodiment will now be described with reference to FIG. 1 which shows a highly schematic plan view of an analysing magnet 1 generating a substantially uniform magnet flux density B throughout its flight tube 2. In this example the direction of the magnetic flux B is into and perpendicular to the plane of the paper and so the dispersion plane is parallel to the plane of the paper. A beam 3 of positive ions, all having substantially the same energy, enters the flight tube 2 and is deflected by the magnetic field. In this example the beam is slightly divergent as it enters the flight tube, and the analysing magnet is arranged to focus only those ions in the beam that have the desired mass/charge ratio on a selection slit 11 in a selection electrode 10 positioned downstream of the exit from the flight tube. The nominal profile of the path through the magnet of the desired ions from the incident beam 3 is shown bounded by broken lines 31. As the figure is a plan view, this nominal profile 31 is also the nominal projection on the dispersion plane of the path of the desired component of the incident beam.

Ions in the incident beam which have different mass/charge ratios will follow curved paths of different radii through the magnet and will strike the walls of the flight tube 2 or the selection electrode 10.

A thermionic electron source in the form of a single electrically conductive filament 5 is positioned inside the flight tube, above the nominal beam oath to reduce the number of ions striking the filament and sputter etching it away. In this example the filament 5 extends along the entire length of the beam path in the magnet and out into drift space. In other examples, the filament may be shorter, located wholly within the flight tube. Also, in other embodiments the filament may comprise a plurality of straight sections, rather than being a continuous curve.

The filament 5 is located in the flight tube above the beam by means not shown in the figure, and runs substantially parallel to the nominal centre of the beam. In fact, in this embodiment the projection of the filament onto the dispersion plane is coincident with the projection of the nominal beam centre line. A power supply 9 is connected to the filament 5 to heat it to a temperature sufficient to cause the filament to emit electrons thermionically. The positioning of the filament 5 ensures that it is linked to the nominal beam profile 31 along its entire length inside the flight tube 2 by magnetic flux B. A perspective view of a section of the filament linked by magnetic flux to the nominal beam profile is shown schematic in FIG. 2. Also shown in the figure is the path of an electron thermionically emitted from the filament. The electron follows a helical path along the magnetic flux passing through the filament, although the figure greatly exaggerates the radius of the circular component of this helical motion. The electron is only able to enter the beam because this flux also links the beam; electron mobility perpendicular to the applied field direction is almost zero. Once inside the beam, the electron is able to provide some neutralisation of the beam space charge.

Figure 1:
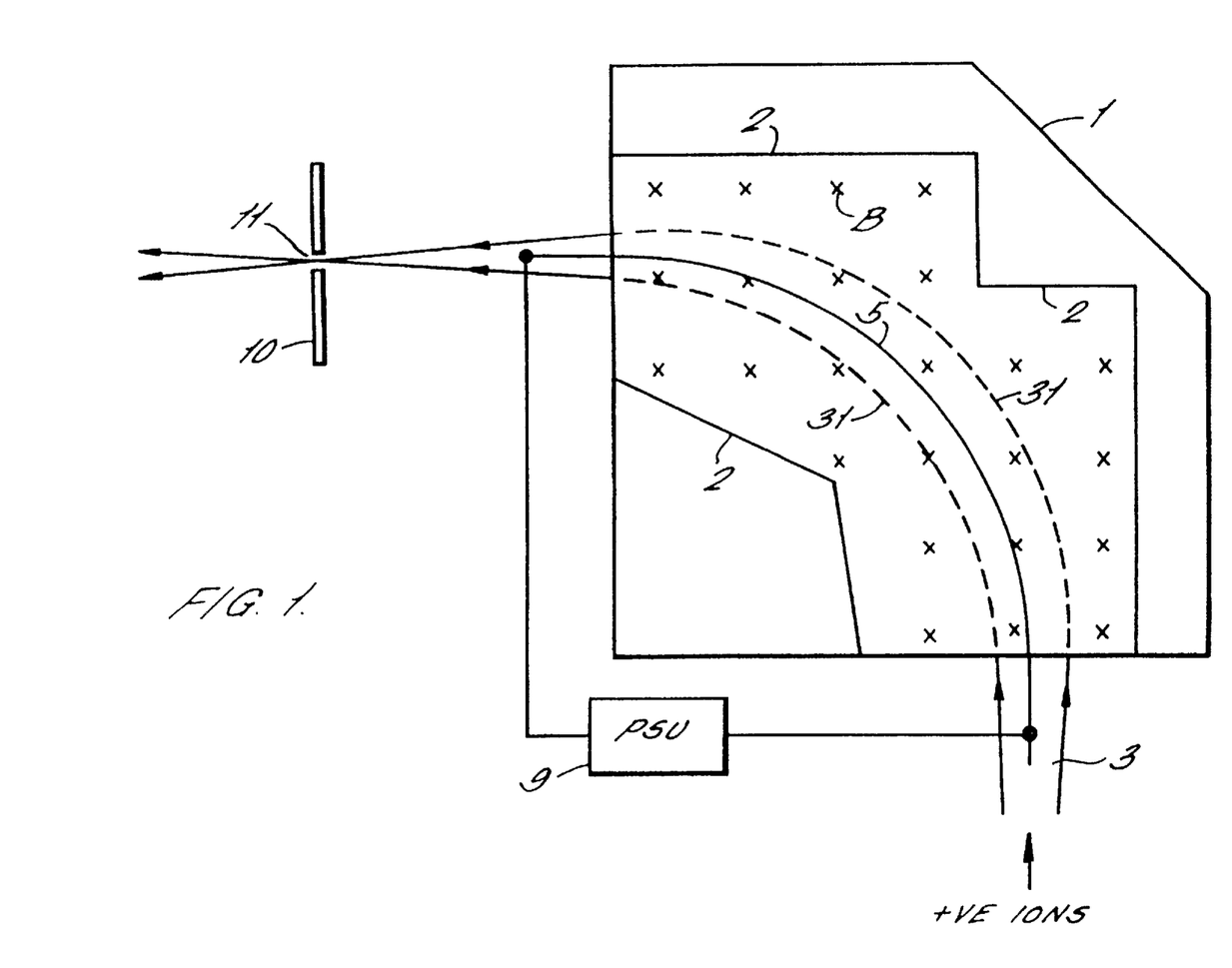
FIG. 1 is a schematic plan view of a first embodiment of the present invention.
Figure 2:
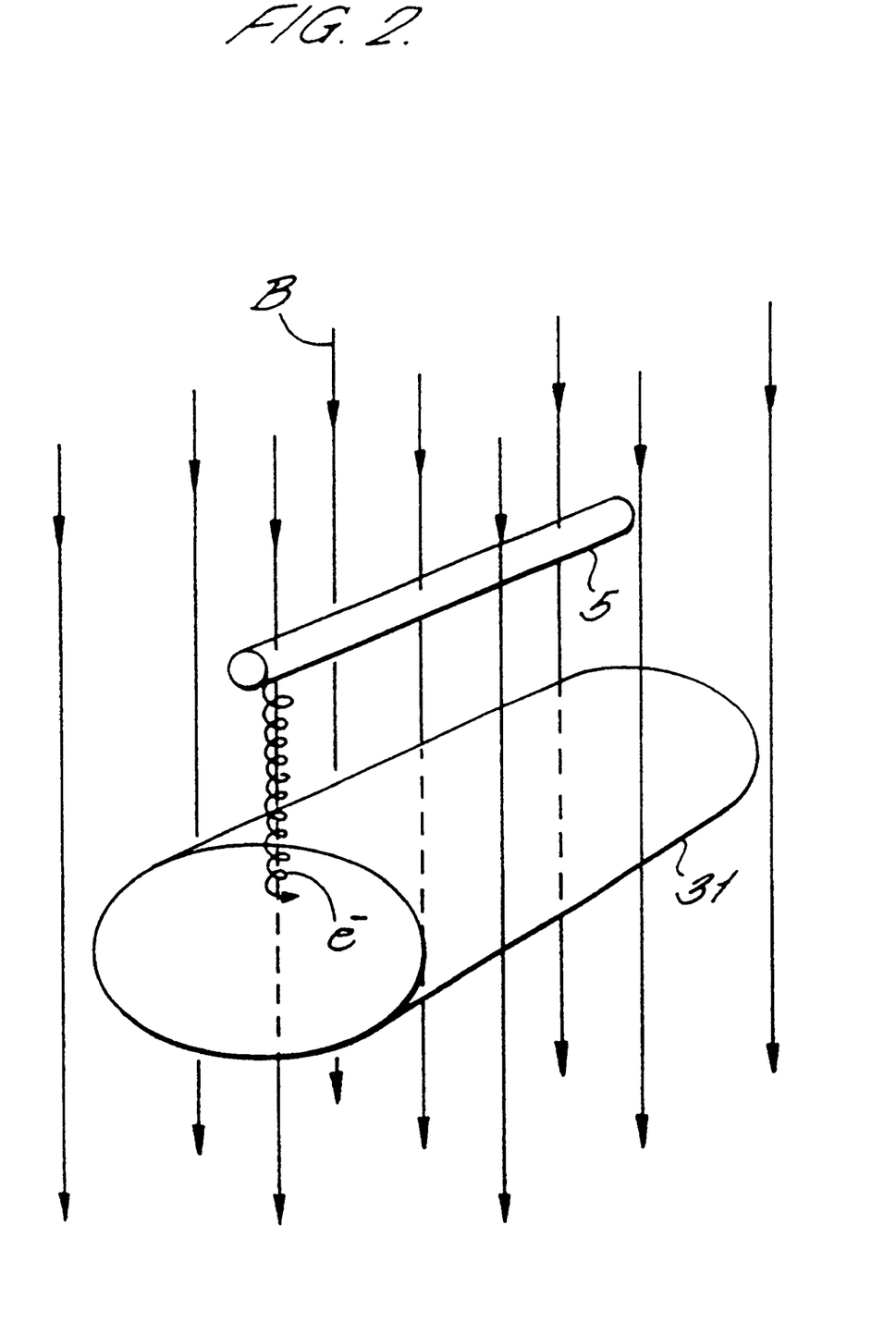
FIG. 2 is a schematic perspective view of part of the embodiment shown in FIG. 1.

In an embodiment similar to that shown in FIG. 1, a tungsten filament was suspended above the nominal median ray of a beam inside a flight tube and electrically heated to temperatures of approximately 2000° C. and higher to cause thermionic emission of electrons into the beam. For a beam of 2 keV boron ions, as the filament temperature was increased to increase thermionic electron emission current, an increase in peak intensity and a decrease in the width of the beam emerging from the analysing magnet was observed, a result attributable to neutralisation of space charge in the beam by thermionically emitted electrons. It was also observed, however, that too high an emission current could actually reduce the beam current exiting the magnet, and so control of filament temperature is desirable to optimise space charge neutralisation.

For an incident ion beam of $^{10}$B and $^{11}$B isotopes, thermionic emission from a tungsten filament was found to enhance only the exiting beam corresponding to one isotope. This effect is attributable to poor spacial overlap between the projections of the filament and the path of ions of the other isotope onto the dispersion plane.

Figure 3:
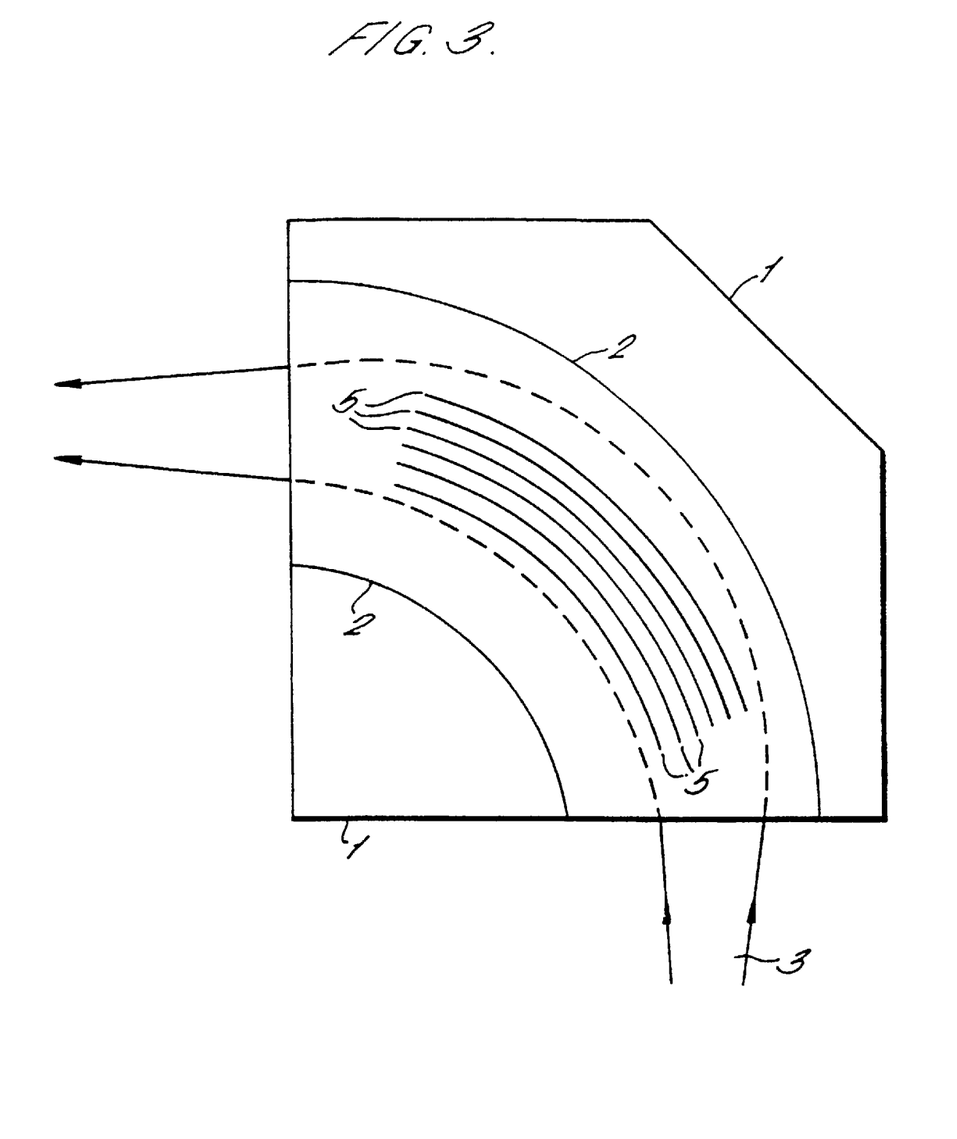
FIG. 3 is a schematic plan view of a further embodiment.

In order to improve space charge neutralisation across the beam, a plurality of substantially longitudinal filaments may be employed. Such an embodiment is shown in FIG. 3. In this example five substantially parallel filaments are located so as to be linked by the flight tube magnetic field to the beam at a plurality of positions along its length and across its width. Means for heating the filaments, which may of course comprise any suitable material, are provided (although not shown in the figure), as are means for supporting the filaments in position in the flight tube.

Figure 4:
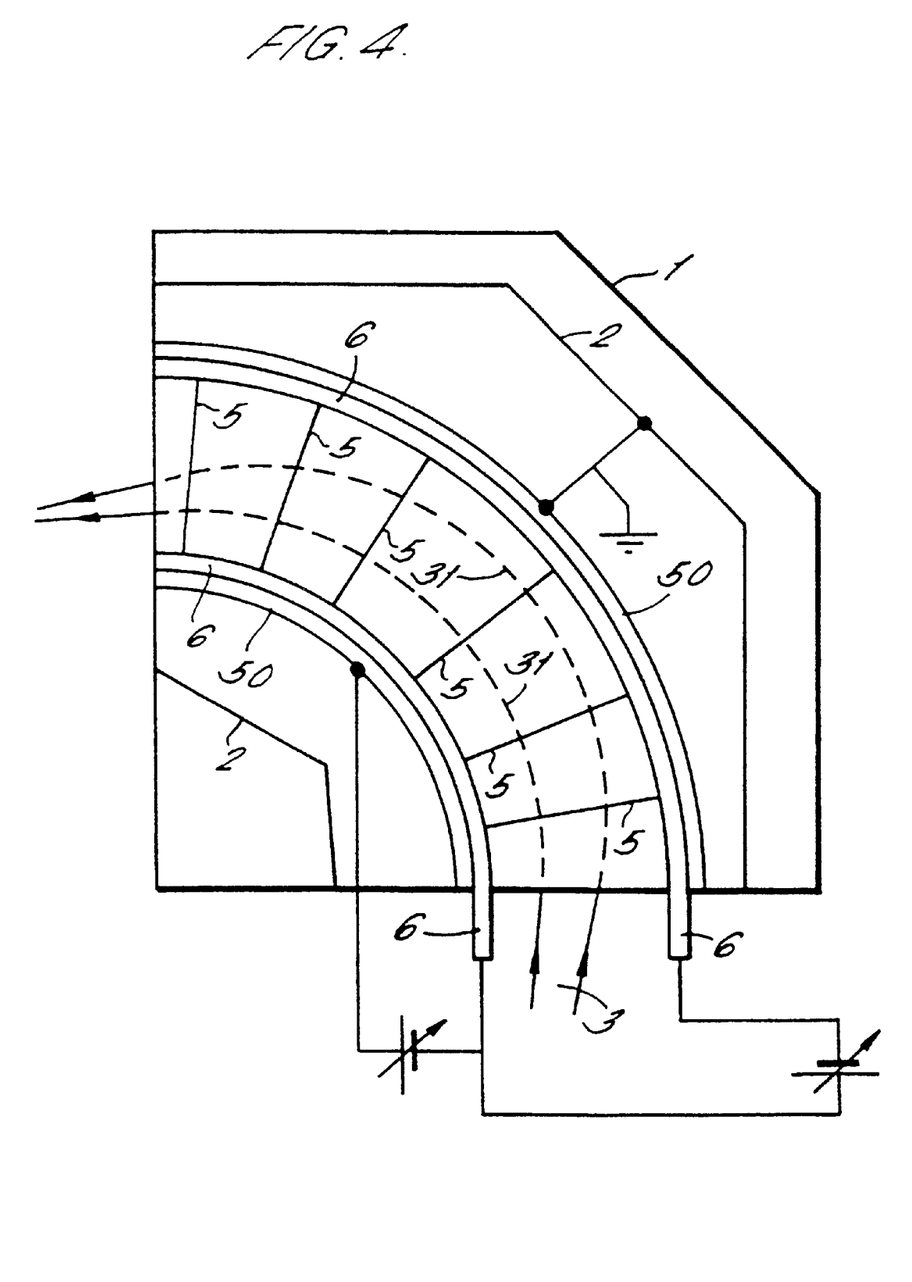
FIG. 4 is a schematic plan view of an embodiment of the present invention.

An alternative way of providing space charge neutralisation at a plurality of positions along the beam and across its width is to employ a series of substantially transverse filaments, as shown schematically in FIG. 4. In general, transverse filaments, and electrical connection to the filaments in particular, are easier to engineer than longitudinal filaments. In this embodiment, the filaments 5 are spaced from each other along the length of the beam, and each transverse filament 5 extends across the nominal beam width, connecting to bus bars 6 on either side of the beam flight path.

The filaments are distributed along the beam and form a substantially planar array. Although in the figure the filaments 5 and bus bars 6 are shown as separate components electrically connected, in alternative embodiments the filaments and bus bars may be formed from a single graphite sheet.

Electrical currents are passed through the filaments by means of the bus bars, to heat the filaments and cause them to emit electrons thermionically. The space charge neutralisation apparatus inside the flight tube 2 is incorporated in an assembly 50, whose cross section is shown schematically in FIG. 5. The outer casing of the assembly 50 can in fact also be referred to as a flight tube as it surrounds the ion beam as it travels through the magnet 1. The casing 50 is electrically conductive and earthed to screen the beam from external electric fields. The filaments 5 are negatively biased with respect to the casing 50 and flight tube 2, and this negative bias is adjustable to control the energy of the thermionically emitted electrons.

Figure 5:
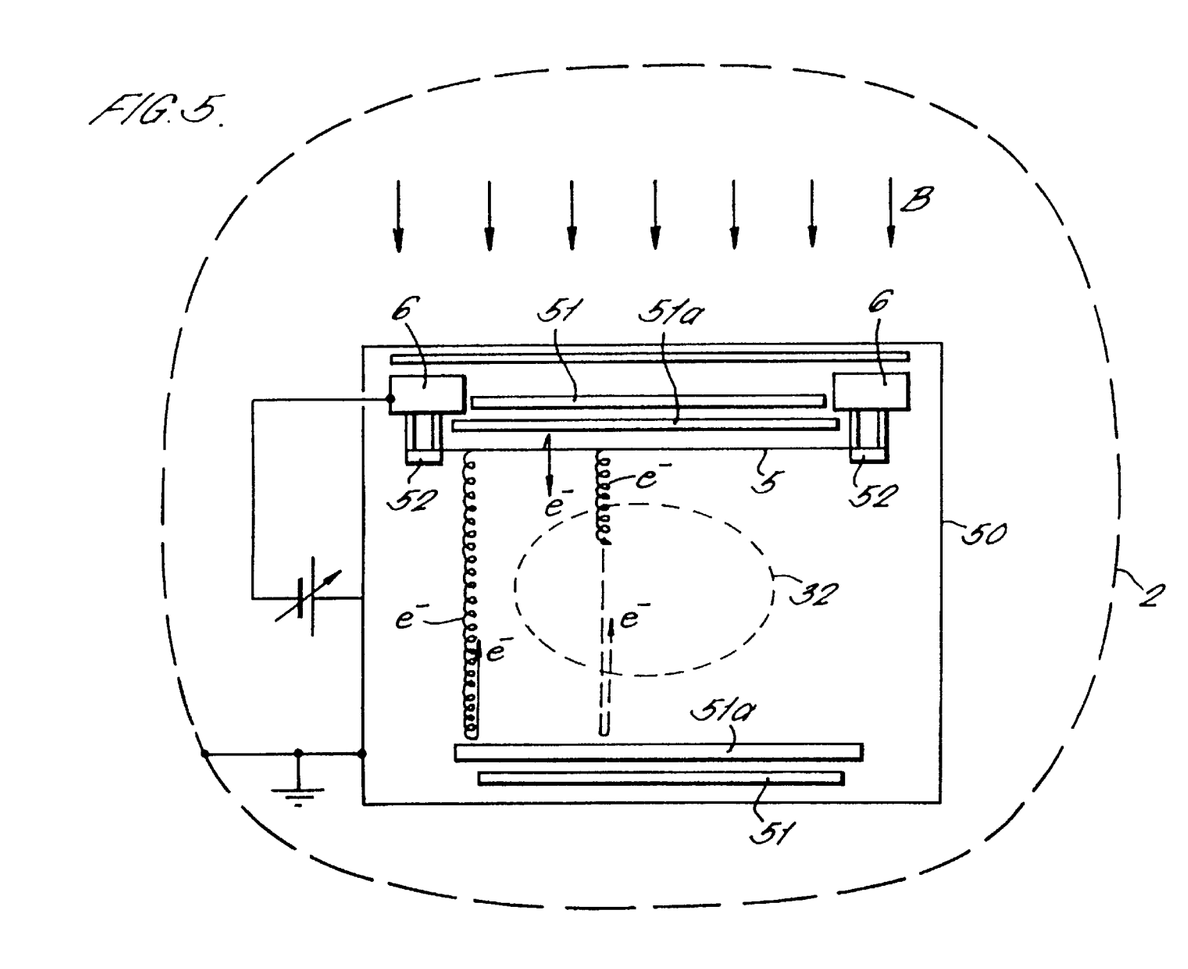
FIG. 5 is a schematic cross section of part of the embodiment shown in FIG. 4.

Referring now to FIG. 5, the transverse filament 5 is fixed and electrically connected to bus bars 6 by means of fixing screws 52 and is linked to the nominal cross section of the beam envelope 32 across its whole width by the magnetic field in the flight tube. In this example, the transverse filaments are positioned above the nominal beam cross section and lie in a plane spaced from and substantially parallel to the dispersion plane. The neutralising assembly 50 further comprises heat shields 51, 51a arranged between the filaments 5 and the top and bottom walls of the flight tube 50. These heat shields reduce the power required to heat the filaments to temperatures sufficient to yield the required emission currents.

The heat shields in this example are substantially planar graphite sheets extending along the nominal beam flight path and fully across the nominal beam width.

The inner heat shields 51a are negatively biased with respect to the filaments 5 and act as electron repellers, able to reflect electrons travelling away from the beam, along magnetic flux lines, back towards the beam. Thus, although an electron emitted from the filament may have sufficient energy to pass through the beam, the repellers may reflect the electron back towards the beam and so increase its contribution to space charge neutralisation.

The bias voltage applied to the inner heat shields 51a is variable, and may be adjusted to achieve optimum neutralisation. For one application, a weak optimum was observed with a bias voltage of −3V.

The filament 5 may be formed from any suitable material, including for example tungsten or graphite. In ion implantation applications in particular it may be preferable to use graphite filaments, as carbon contamination of the beam (and hence of the target substrate) caused by parts of the beam striking the filaments and sputtering off material is much more tolerable than metal contamination. In addition, any carbon deposits inside the apparatus resulting from sputtering off the filaments are more easily removed, for example by oxidation and evacuation.

On the other hand, it may be desirable to use tungsten or other metal filaments for their superior robustness.

It will be apparent that in other embodiments, a thermionic electron source comprising a combination of transverse and longitudinal filaments may be employed, for example in the form of a fine wire mesh positioned "over" the beam path.

In general, the greater the spatial frequency of the filaments along and across the beam, the greater the homogeneity of space charge neutralisation.

Figure 6:
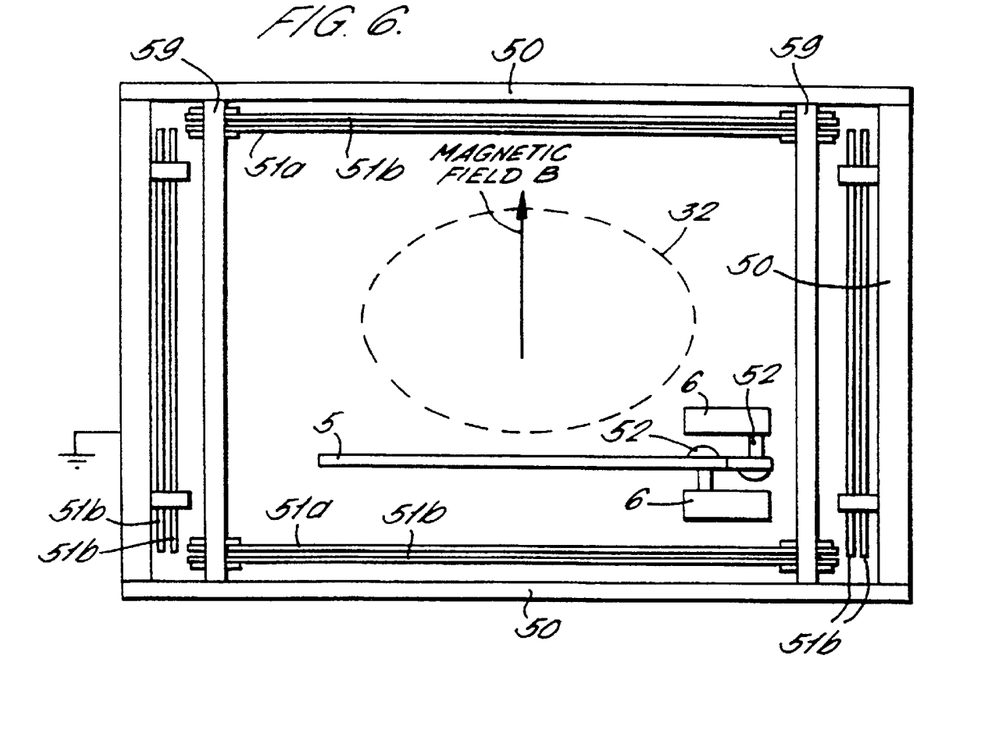
FIG. 6 is a schematic cross section of part of a further embodiment.

FIG. 6 shows a schematic cross section of a neutraliser assembly 50 in accordance with a further embodiment of the present invention. The casing of the assembly is optional, but in this example is made from aluminium and is grounded. The casing may be integrated with the vacuum flight tube 2 or even the analyser magnet poles themselves.

Inside the casing, a plurality of substantially hairpin-like graphite filaments 5 are spaced along the nominal beam flight path, each filament extending in a plane parallel to the dispersion plane and across the beam width (i.e. they are substantially transverse filaments). Connecting means 52 connect each filament 5 to bus bars 6 positioned on the same side of the beam. The filaments form a substantially planar array.

The direction of the flight tube magnetic field is shown, and, in the arbitrary orientation of the figure, the filaments are accordingly positioned adjacent and underneath the nominal beam cross section 32.

Outer graphite heat shields 51b are grounded, as are the inner side heat shields. In contrast, the inner top and bottom heat shields 51a are negatively biased with respect to the filaments 5 to act as electron repellers.

The use of electron repellers is an important factor in achieving appreciable beam space charge neutralisation in embodiments where the thermionic electron source is arranged outside the nominal beam envelope.

The support posts 59 are non-conductive and may, for example, be alumina, or graphite with alumina collars.

Figure 7:
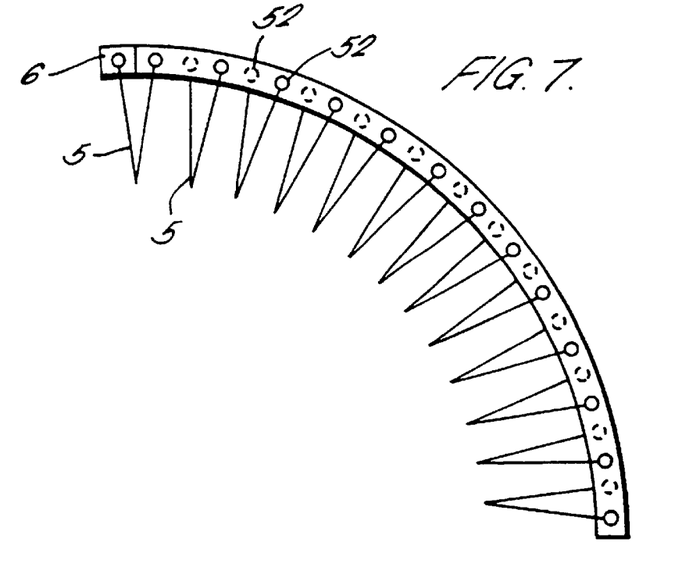
FIG. 7 is a schematic diagram of part of the embodiment of FIG. 6.

FIG. 7 shows a highly schematic plan view of the arrangement of just the transverse hairpin filaments 5 and bus bars 6 of the embodiment of FIG. 6. As can be seen, the bus bars follow curved paths substantially parallel to the beam (ie. following the arc of the analysing magnet) and the hairpin filaments are equispaced along the bus bars. In this example, the hairpin filaments are V-shaped, although of course other geometries are possible. The hairpin or V-shaped geometries, where the filaments connect to bus bars on the same side of the beam, are particularly advantageous for graphite filaments, which are brittle. Brittle straight graphite filaments connected to bus bars on either side of the beam have a tendency to break as a result of relative movement of the bus bars and/or thermal expansion effects. Hairpin geometry alleviates this problem.

In general, the greater the number of transverse filaments used, the better the space charge neutralisation of the beam. On an analysing magnet with a radius of 40 cm, for example, good space charge neutralisation can be achieved using around 20 filaments.

Figure 8:
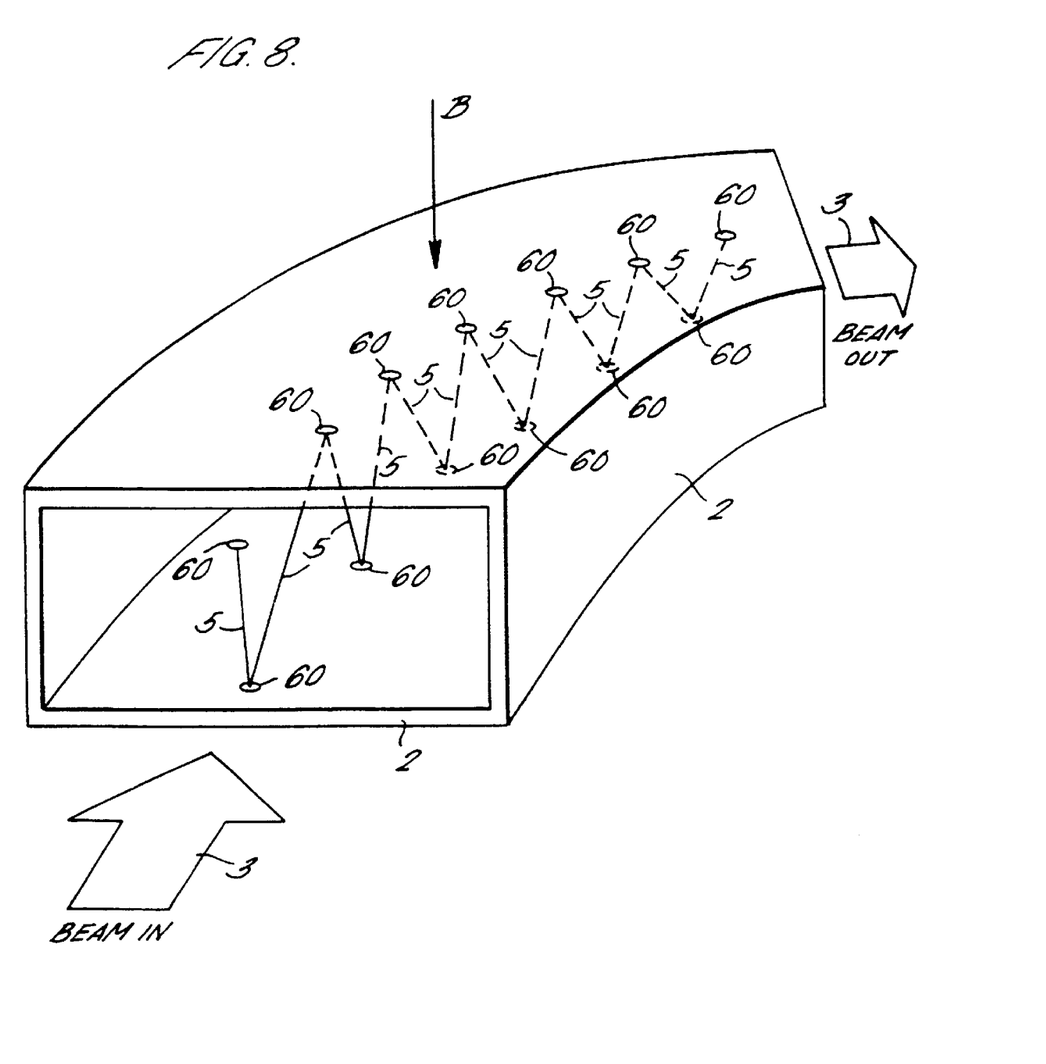
FIG. 8 is a schematic perspective view of part of a further embodiment.

FIG. 8 shows part of another embodiment in which the thermionic electron source is arranged inside the flight tube 2 (or beam vacuum chamber) and at least partially in the nominal path of the beam. The thermionic electron source comprises an array of filaments 5, arranged in a "zig-zag" pattern between the top and bottom of the flight tube 2 and extending along the nominal centre line of the beam. The array thus lies substantially on a curved path along the beam centre and extends over the full "height" of the beam (the "height" being defined as the extent of the beam in a direction parallel to the applied field B).

The filaments are attached to the flight tube 2 by a series of insulators 60.

In this embodiment the filaments 5 are formed from refractory material and are arranged to be heated by the beam only. In other embodiments the filaments may be heated electrically at least in part, and may be connected electrically in series or in parallel. In these other embodiments, appropriate electrical feedthroughs to the filaments are provided.

In alternative embodiments, the thermionic electron source may be a grid arranged at least partially inside the nominal beam envelope.

Figure 9:
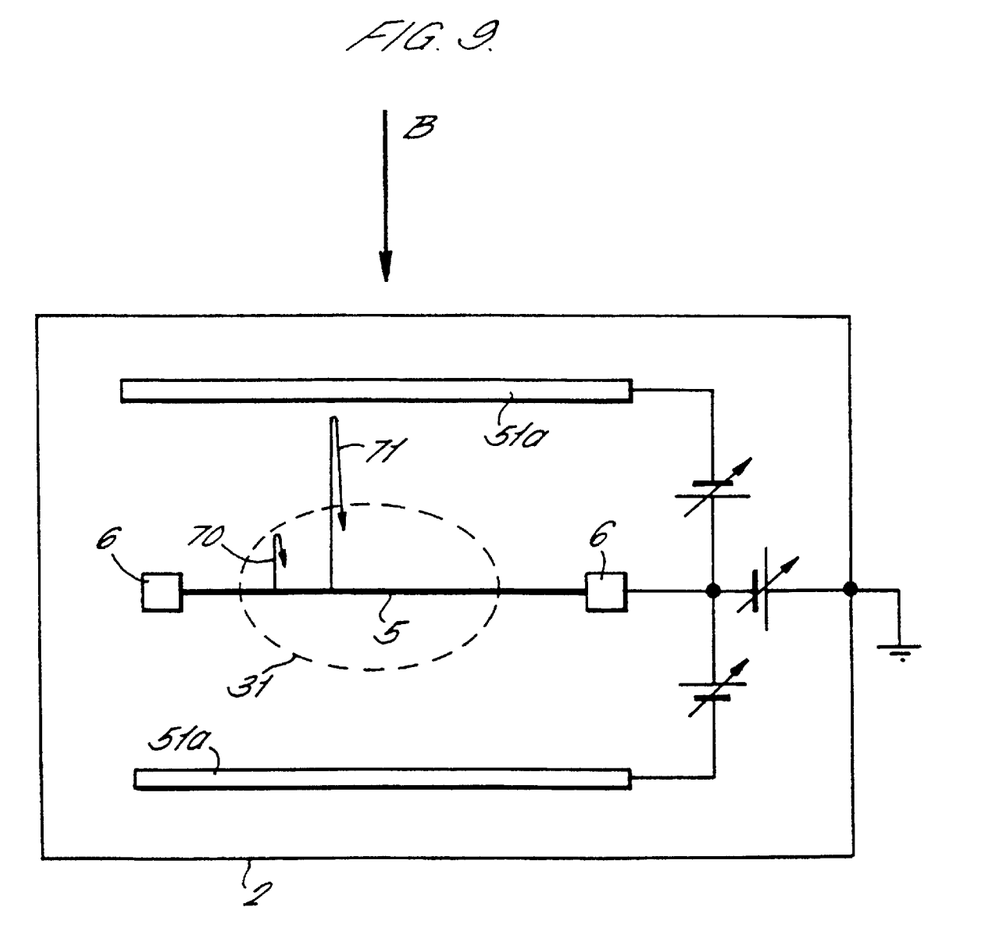
FIG. 9 is a schematic diagram of the cross section of part of an embodiment of the present invention.

FIG. 9 shows a schematic cross section of part of another embodiment, in which the thermionic electron source comprises a substantially planar array of filaments 5 arranged across the nominal centre of the beam envelope 31, the filaments being heated, at least in part, electrically by a current supplied by means of bus bars 6 at the sides of the beam path. The flight tube 2 is earthed, and the array of filaments 5 is negatively biased with respect to the flight tube to control the energy of electrons injected into the beam.

Electron repellers 51a are arranged above and below the nominal beam envelope 31 and are each negatively biased with respect to the filament array 5. All bias voltages are adjustable.

Low energy emitted electrons 70 may be confined in the beam by the beam potential well, whereas more energetic electrons 71 may escape the beam but be reflected back into it by the repellers 51a.

It will be apparent from the preceding description that the present invention is not limited in its application to the neutralisation of beam space charge in analysing magnets, and may be applied in other regions of applied magnetic field, which may be static or varying, for example, in bending or scanning magnets.

What is claimed is:

1. Ion beam apparatus comprising:
   an analysing magnet including a flight tube for receiving and conveying through the magnet a beam of ions, the magnet being operable to generate a substantially uniform magnetic field in the flight tube to deflect beam ions according to their mass/charge ratio in a dispersion plane perpendicular to the direction of said uniform magnetic field; and a thermionic electron source inside the flight tube, arranged adjacent and outside a nominal cross section of a beam of ions travelling through the magnet and extending along a nominal flight path of a beam travelling through the magnet, the thermionic electron source being further arranged such that the projection of the thermionic electron source on the dispersion plane and the nominal projection o n the dispersion plane of an ion beam travelling through the magnet overlap at a plurality of positions along the nominal flight path of the beam.

2. Ion beam apparatus in accordance with claim 1, wherein the thermionic electron source extends along the nominal flight path substantially in a plane spaced from and parallel to the dispersion plane.

3. Ion beam apparatus in accordance with claim 1, wherein the thermionic electron source comprises an electrically conductive filament arranged to emit electrons thermionically and extending along the nominal flight oath and positioned substantially parallel to the nominal centre of a beam of ions travelling through the magnet, the filament having a projection on the dispersion plane which for at least a substantial part of the length of the filament overlaps the nominal projection on the dispersion plane of a beam of ions travelling through the magnet.

4. Ion beam apparatus in accordance with claim 3 comprising a plurality of said electrically conductive filaments arranged such that the projections of said filaments on the dispersion plane lie substantially parallel to each other and are spaced apart across the width of the nominal projection of the beam on the dispersion plane.

5. Ion beam apparatus in accordance with claim 1 wherein the thermionic electron source comprises a plurality of electrically conductive filaments arranged to emit electrons thermionically, each filament having a projection on the dispersion plane extending across at least part of the width of the nominal projection on the dispersion plane of a beam of ions travelling through the magnet, said filaments being spaced apart from each other along the nominal flight path.

6. Ion beam apparatus in accordance with claim 5 wherein the projection of each said filament extends fully across the width of the nominal beam projection.

7. Ion beam apparatus in accordance with claim 5 wherein each said filament has a substantially hairpin-like geometry.

8. Ion beam apparatus in accordance with claim 3 wherein said filament or each of said plurality of filaments comprises tungsten.

9. Ion beam apparatus in accordance with claim 3 wherein said filament or each of said plurality of filaments comprises carbon.

10. Ion beam apparatus in accordance with claim 1 further comprising at least one heat shield arranged between the thermionic electron source and the inside of the flight tube.

11. Ion beam apparatus comprising:
an analysing magnet including a flight tube for receiving and conveying through the magnet a beam of ions, the magnet being operable to generate a substantially uniform magnetic field in the flight tube to deflect beam ions according to their mass/charge ratio in a dispersion plane perpendicular to the direction of said uniform magnetic field; and a thermionic electron source inside the flight tube, extending along the nominal flight path of said beam and being arranged inside the nominal envelope of said beam.

12. Ion beam apparatus in accordance with claim 11, wherein said thermionic electron source comprises an array of filaments, said array extending along the nominal centre of said beam.

13. Ion beam apparatus in accordance with claim 12, wherein said array extends at least partially across the nominal height of said beam in the direction of said uniform magnetic field.

14. Ion beam apparatus in accordance with claim 13, wherein said array lies substantially on a curved surface, said curved surface having the same projection on the dispersion plane as the nominal beam centre line.

15. Ion beam apparatus in accordance with claim 12, wherein said array is substantially planar and parallel to the dispersion plane.

16. Ion beam apparatus in accordance with claim 12 wherein said array extends at least partially across the nominal width of said beam in a direction parallel to the dispersion plane.

17. Ion beam apparatus in accordance with claim 12, wherein said filaments are electrically conductive.

18. Ion beam apparatus in accordance with claim 17, wherein said filaments comprise carbon.

19. Ion beam apparatus in accordance with claim 12, wherein said filaments comprise refractory material.

20. Ion beam apparatus in accordance with claim 11, further comprising a selection slit arranged to admit only a selected portion of ions conveyed through said magnet to the remainder of said apparatus, said thermionic electron source being arranged such that no part of the source inside the nominal beam envelope is in direct line of sight with said selection slit.

21. Ion beam apparatus comprising:
a magnet arranged to generate a magnetic field in a flight tube to deflect a beam of ions travelling through said flight tube; and a thermionic electron source inside said flight tube, extending along the nominal flight path of said beam and arranged to emit electrons thermionically into said beam.

22. Ion beam apparatus in accordance with claim 21, wherein said thermionic electron source is arranged adjacent and outside the nominal envelope of said beam in said flight tube and is further arranged to be linked to said beam at a plurality of position along said nominal flight path by magnetic flux generated by the magnet.

23. Ion beam apparatus in accordance with claim 21, wherein at least part of said thermionic electron source is arranged inside the nominal envelope of said beam.

24. Ion beam apparatus in accordance with claim 21, wherein said thermionic electron source comprises an array of filaments.

25. Ion beam apparatus in accordance with claim 24, herein said array is substantially planar and perpendicular to said magnetic field.

26. Ion beam apparatus in accordance with claim 1, further comprising a supply of charge-neutral atoms or molecules arranged to introduce said atoms or molecules into the flight tube for ionisation by thermionically emitted electrons.

27. Ion beam apparatus in accordance with claim 1 wherein said thermionic electron source is arranged to have a negative bias voltage with respect to the flight tube.

28. Ion beam apparatus in accordance with claim 27 wherein the negative bias voltage of said thermionic electron source is adjustable.

29. Ion beam apparatus in accordance with claim 1, further including an electron repeller arranged inside the flight tube, outside the nominal beam envelope, and between the thermionic electron source and a wall of the flight tube, the electron repeller being substantially planar and extending along the nominal flight path of the beam, the projection of the electron repeller onto a plane perpendicular to the direction of said magnetic field at least partially overlapping the nominal projection of said beam onto said plane, the electron repeller being further arranged to have a negative bias voltage with respect to the thermionic electron source.

30. Ion beam apparatus in accordance with claim 29, wherein the negative bias voltage of the electron repeller is adjustable.

31. Ion beam apparatus in accordance with claim 29, wherein the electron repeller comprises a sheet of graphite.

32. Ion beam apparatus in accordance with claim 29, wherein the electron repeller is also a heat shield.

33. Ion beam apparatus in accordance with claim 29, further comprising a second said electron repeller, the electron repeller and second electron repeller being arranged on opposite sides of the beam.

34. A method of neutralising space charge in a beam of ions travelling in a flight tube through a magnet, the method comprising the steps of:
   providing a source of thermionic electrons inside the flight tube, adjacent and outside the nominal cross section of the beam and extending along the nominal flight path of the beam;
   arranging the thermionic electron source to be linked to the beam at a plurality of positions along the nominal flight path by magnetic flux generated by the magnet; and
   emitting electrons thermionically from the thermionic electron source.

35. A method in accordance with claim 34 further comprising the step of arranging the thermionic electron source to be linked to the beam at a plurality of positions across the width of the beam by magnetic flux generated by the magnet.

36. A method of neutralising space charge in a beam of ions travelling in a flight tube through a magnet, the method comprising the steps of:
   providing a source of thermionic electrons inside the beam, said source extending along the beam; and
   emitting electrons thermionically from said source.

37. A method in accordance with claim 34, to 36, further comprising the steps of:
   negatively biasing the thermionic electron source with respect to the flight tube; and
   adjusting the negative bias of the thermionic electron source to control the energy of the emitted electrons.

38. A method in accordance with claim 34, further comprising the step of reflecting electrons escaping the beam back towards the beam using at least one negatively biased electron repeller.

39. A method in accordance with claim 34, further comprising the steps of introducing charge-neutral atoms or molecules into the flight tube and ionising said atoms or molecules with said thermionically emitted electrons.

* * * * *